United States Patent
Zanbaghi et al.

(10) Patent No.: US 10,460,819 B2
(45) Date of Patent: Oct. 29, 2019

(54) NOISE REDUCTION IN VOLTAGE REFERENCE SIGNAL

(71) Applicant: Cirrus Logic International Semiconductor Ltd., Edinburgh (GB)

(72) Inventors: Ramin Zanbaghi, Austin, TX (US); Tejasvi Das, Austin, TX (US); John L. Melanson, Austin, TX (US); Axel Thomsen, Austin, TX (US)

(73) Assignee: Cirrus Logic, Inc., Austin ( * ) Notice: Subject to any disclaimer, the term of this patent is extended or adjusted under 35 U.S.C. 154(b) by 0 days.

(21) Appl. No.: 15/365,451

(22) Filed: Nov. 30, 2016

(65) Prior Publication Data
US 2018/0152174 A1 May 31, 2018

(51) Int. Cl.
| | |
|---|---|
| G11C 27/02 | (2006.01) |
| H03H 19/00 | (2006.01) |
| H03M 1/08 | (2006.01) |
| H03M 1/12 | (2006.01) |
| G11C 7/04 | (2006.01) |
| H03M 1/06 | (2006.01) |

(Continued)

(52) U.S. Cl.
CPC .............. G11C 27/024 (2013.01); G11C 7/04 (2013.01); H03H 19/004 (2013.01); H03M 1/0641 (2013.01); H03M 1/0863 (2013.01); H03M 1/1245 (2013.01); H03M 1/66 (2013.01); H03M 3/458 (2013.01)

(58) Field of Classification Search
CPC ... H04N 5/3515; H04N 5/3577; G11C 27/024
See application file for complete search history.

(56) References Cited

U.S. PATENT DOCUMENTS

| | | | | | |
|---|---|---|---|---|---|
| 4,200,863 | A | * | 4/1980 | Hodges | ................... H03M 1/38 341/156 |
| 5,463,346 | A | * | 10/1995 | Brooks | .................. H03H 11/04 327/553 |

(Continued)

OTHER PUBLICATIONS

Kuppambatti Jayanth et al. "Current Reference Pre-Charging Techniques for Low-Power Zero-Crossing Pipeline-Bar ADCs", IEEE Journal of Solid-State Circuits, vol. 49, No. 3, Mar. 1, 2014 (Mar. 1, 2014), pp. 383-694, IEEE Service Center, Piscataway, NJ, USA.

(Continued)

Primary Examiner — Thomas J. Hiltunen
(74) Attorney, Agent, or Firm — Norton Rose Fulbright US LLP

(57) ABSTRACT

A variable resistor may be coupled between a reference voltage source and components of an integrated circuit to reduce issues relating to thermal noise from a reference voltage signal generated by the reference voltage source. The variable resistor may be set to a low level during a first time period and a high level during a second time period, in which the time periods correspond to a sampling period of a switched-capacitor circuit. The low resistance time period may allow quick settling of an input reference voltage signal, whereas the high resistance time period may reduce a bandwidth of noise on a sampling capacitor coupled to the reference voltage signal. The variable resistor and switched-capacitor network may be used in an analog-to-digital converter (ADC), such as in audio circuits.

16 Claims, 6 Drawing Sheets

(51) Int. Cl.
*H03M 3/00* (2006.01)
*H03M 1/66* (2006.01)

(56) References Cited

U.S. PATENT DOCUMENTS

| | | | | |
|---|---|---|---|---|
| 5,644,257 A | * | 7/1997 | Kerth | G06G 7/14 |
| | | | | 327/271 |
| 5,781,312 A | * | 7/1998 | Noda | H04N 5/3575 |
| | | | | 348/272 |
| 6,111,606 A | * | 8/2000 | Ikeda | H04N 5/3575 |
| | | | | 327/552 |
| 6,559,715 B1 | * | 5/2003 | Frake | H03H 1/02 |
| | | | | 327/552 |
| 7,310,507 B2 | * | 12/2007 | Mizumasa | H03H 7/0153 |
| | | | | 455/307 |
| 7,502,603 B2 | * | 3/2009 | Mohindra | H04B 1/30 |
| | | | | 375/319 |
| 7,936,297 B2 | * | 5/2011 | Hurrell | H03M 1/0626 |
| | | | | 341/155 |
| 7,944,378 B1 | * | 5/2011 | Pesenti | H03M 1/1014 |
| | | | | 341/118 |
| 7,948,539 B2 | * | 5/2011 | Yamaguchi | H04N 5/3575 |
| | | | | 348/241 |
| 8,040,264 B2 | * | 10/2011 | Hummerston | H03M 1/12 |
| | | | | 327/94 |
| 8,179,293 B2 | | 5/2012 | Chen | |
| 8,664,998 B2 | * | 3/2014 | Yang | H02M 1/34 |
| | | | | 327/337 |
| 9,166,608 B1 | * | 10/2015 | Deguchi | H03M 1/0604 |
| 9,391,628 B1 | * | 7/2016 | Lyden | G11C 27/026 |
| 9,444,468 B2 | * | 9/2016 | Astrom | H03L 7/06 |
| 9,450,566 B2 | * | 9/2016 | Pamarti | H03H 19/00 |
| 9,812,474 B2 | * | 11/2017 | Yagi | H01L 27/14609 |
| 2003/0234641 A1 | * | 12/2003 | Bottomley | G11C 27/024 |
| | | | | 324/76.42 |
| 2005/0146225 A1 | * | 7/2005 | Yamamoto | G09G 3/3655 |
| | | | | 307/72 |
| 2011/0026507 A1 | * | 2/2011 | Katsube | H03H 7/0153 |
| | | | | 370/338 |
| 2011/0215957 A1 | * | 9/2011 | Hummerston | H03M 1/12 |
| | | | | 341/155 |
| 2012/0092055 A1 | | 4/2012 | Peschke et al. | |
| 2013/0335163 A1 | * | 12/2013 | Aggarwal | H03H 7/12 |
| | | | | 333/132 |
| 2015/0244385 A1 | | 8/2015 | Alladi et al. | |
| 2015/0268360 A1 | * | 9/2015 | Kumar, Sr. | G01N 23/04 |
| | | | | 378/62 |

OTHER PUBLICATIONS

Baker and Oljaca, "How the voltage reference affects ADC performance, Part 3", Texas Instruments, Dec. 1, 2009 (Dec. 1, 2009), XP55445943, Retrieved from the Internet: URL:http://www.ti.com/lit/an/slyt355/slyt355.pdf.

* cited by examiner

NOISE REDUCTION IN VOLTAGE REFERENCE SIGNAL

FIELD OF THE DISCLOSURE

The instant disclosure relates to integrated circuits. More specifically, portions of this disclosure relate to reference signals for integrated circuits.

BACKGROUND

Reference signal circuits are used to provide reference voltages or reference currents in a wide variety of integrated circuits (ICs). Within an integrated circuit, the reference voltages or currents may be used in many different circuits to provide proper reference levels for various transistor circuitry. Generally, a highly accurate and non-temperature dependent circuit, such as a band-gap voltage source, is used to generate a reference voltage or current. Such a stable reference voltage improves predictability of transistor circuitry operating with a reference voltage or current.

One integrated circuit that may operate using a reference voltage is a delta-sigma analog-to-digital converter (ADC). When a reference voltage source is coupled to the ADC, thermal noise in a reference voltage signal generated by the reference voltage source can degrade performance of the ADC. One conventional solution for reducing the thermal noise entering the ADC is the use of an external capacitor to limit noise bandwidth. FIG. 1 is a circuit illustrating an external capacitor between a reference voltage source and an ADC according to the prior art. An ADC 110 receives an analog input signal $V_{in}$ at input node 102 for conversion to a digital output signal $D_{out}$ at output node 104. The ADC 110 may include a pin 120 for connection of an external capacitor 122 for filtering a reference voltage signal $V_{ref}$. The external capacitor 122 can be large and thus consumes extra foot print on the electronic board inside small or low-profile electronic devices, such as mobile phones. Further, the external capacitor 122 adds cost to the construction of the electronic device. Another disadvantage of the external capacitor 122 is the requirement for one or more additional pins on the chip connecting to the external capacitor 122, which increases cost and area.

Shortcomings mentioned here are only representative and are included simply to highlight that a need exists for improved electrical components, particularly for analog-to-digital converters (ADCs) employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

A variable resistor may be coupled between a reference voltage source and components of a switched-capacitor integrated circuit to reduce issues relating to thermal noise from a reference voltage signal generated by the reference voltage source. The variable resistor may also provide benefits regarding other types of noise within the integrated circuit and/or other signal errors within the integrated circuit. One integrated circuit that benefits from the use of the variable resistor is a switched-capacitor analog-to-digital converter (ADC). The variable resistor may be integrated with the analog-to-digital converter (ADC) as part of a single integrated circuit, such as in an audio controller or audio coder/decoder (CODEC). Other integrated circuits that couple to a reference signal generator may implement the variable resistor, such as digital-to-analog converters (DACs) and other switched-capacitor circuits.

The variable resistor may be implemented as a fixed resistor in parallel with a switch. When the switch is in a conducting state, the variable resistor may have a low resistance, which may be proportional to a resistance of the switch and/or a resistance in series with the switch. When the switch is in a non-conducting state, the variable resistor may have a high resistance, which may be proportional to a resistance of the resistor. In some embodiments, multiple resistors and/or multiple switches may be used to create specific resistance values and/or additional resistance states above the two in the example above. Although examples described below may include a combination of a resistor and switch configured as a variable resistor, other forms of variable resistors may be used as part of an electronic device for coupling a reference voltage signal to components within an integrated circuit. For example, another variable resistor that may be implemented in an electronic device is a varistor. Further, although a variable resistor is described in many examples, other techniques for decoupling the reference signal generator from other components of the integrated circuit may be implemented through an artifact reduction network (ARN), of which a variable resistor is one example.

The variable resistor may be controlled to change resistance at particular times during operation of the integrated circuit. For example, the resistance may be controlled to change between the high resistance state and the low resistance state at specific times during operation of a switched capacitor (SC) network coupled to the reference signal generator. During a sampling period of the S-C network, the variable resistor may be controlled to be in a low resistance state during a first portion of the sampling period and to be in a high resistance state during a second portion of the sampling period. A high resistance during a time period $t_1$ of the sampling period may allow the reference signal to settle, whereas a low resistance during a later time period $t_2$ of the sampling period may reduce a thermal noise contribution from a reference signal on a sampling capacitor of the S-C network during a sampling phase. Adjusting the duration of time periods $t_1$ and $t_2$ allow a balance to be achieved between settling error and buffer noise reduction.

The variable resistor may be controlled to change states during various time periods by a controller configured through hardware, firmware, and/or software. The controller may receive one or more switching signals, or copies of the one or more switching signals, used to operate the switched capacitor network. The controller may then generate one or more control signals appropriate for controlling the variable resistor based on the one or more switching signals. For example, when the variable resistor includes a switch in parallel with a resistor, the controller may generate a gate signal for the switch to toggle the variable resistor between a high resistance state with the resistor not shorted by the switch and a low resistance state with the resistor shorted by the switch. In some embodiments, the controller may generate a control signal to adjust the variable resistor to set a resistance value of the variable resistor at a first level during a first time period and to set the resistance value of the variable resistor at a second level higher than the first level during a second time period, wherein the first time period and the second time period are at least part of a first sampling period of the switched-capacitor circuit. When an artifact reduction network (ARN) is used, the one or more control signals may be used to set the ARN as transparent during a time period $t_1$ to not affect settling accuracy and may be used to set the ARN as active during a time period $t_2$ to limit sampling network bandwidth. The controller may also or alternatively generate the one or more control signals based on an early version of the one or more switching signals. For example, an early version of a sampling clock for the S-C network may be monitored by the controller and used to generate one or more control signals to control the variable resistor.

The sampling period for the S-C network may be further divided into additional time periods during which the variable resistor is controlled. For example, an initial time period $t_0$ at a beginning of the sampling period, before the time periods $t_1$ and $t_2$, may be used to set the variable resistor in a high resistance state. A high resistance during time period $t_0$ may reduce a kickback current traveling to the reference signal generator. The kickback voltage may be reduced by the variable resistor acting as a low-pass filter (LPF) to filter out a high frequency feedback traveling in the direction of the reference signal generator. Although a high resistance state is described for the time period $t_0$, the resistance of the variable resistor does not need to be the same resistance during time period $t_0$ as time period $t_2$. The resistance during time period $t_0$ may be higher than during time period $t_1$.

Electronic devices incorporating the variable resistor described above may benefit from reduced noise in components of integrated circuits in the electronic devices. The integrated circuits may include an analog-to-digital converter (ADC) using a switched capacitor (S-C) network. The S-C network may be coupled to a reference signal generator, such as a bandgap reference voltage generator, through the variable resistor. The ADC may be used to convert an analog signal, such as an audio signal, to a digital representation of the analog signal. Such an ADC, or a similar digital-to-analog converter (DAC), may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

A variable resistor may be coupled between a reference signal generator and a switched-capacitor (S-C) network of an integrated circuit that operates using the generated reference signal. A controller may operate the variable resistor to change a resistance level of the variable resistor during operation of the integrated circuit, such as during a sampling phase of the switched-capacitor network. Controlling the variable resistor may reduce a thermal noise contribution from a reference signal on a sampling capacitor of the S-C network during a sampling phase. One method for operating a variable resistor is described with reference to FIG. 2.

Figure 1:
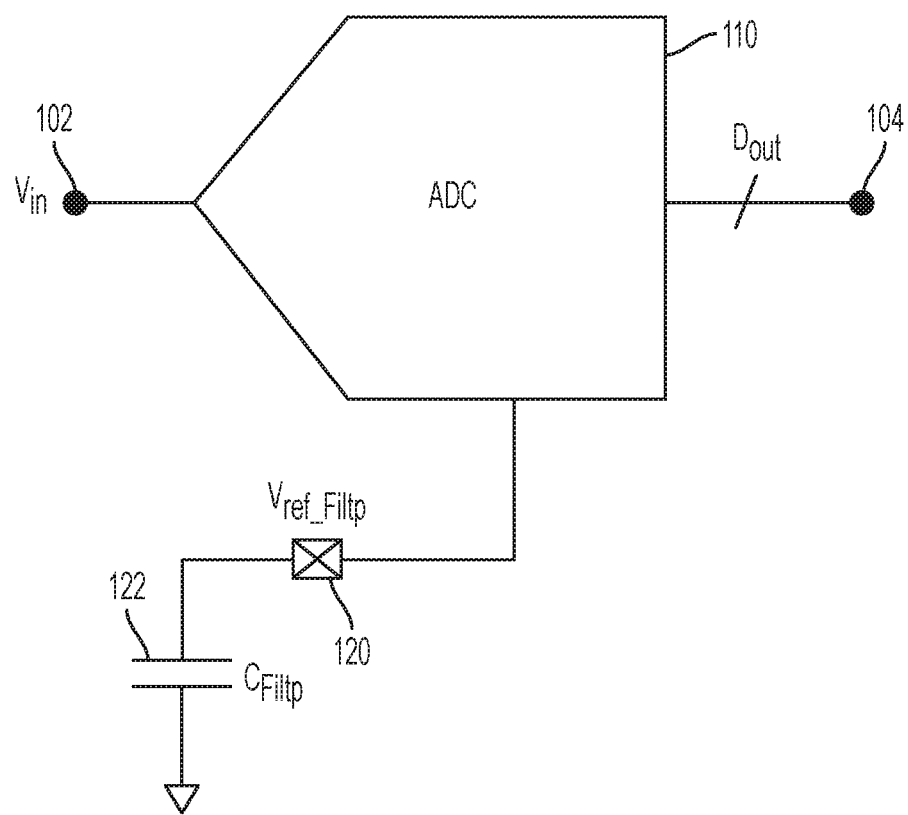
FIG. 1 is a circuit diagram illustrating an external capacitor between a reference voltage source and an ADC according to the prior art.
Figure 2:
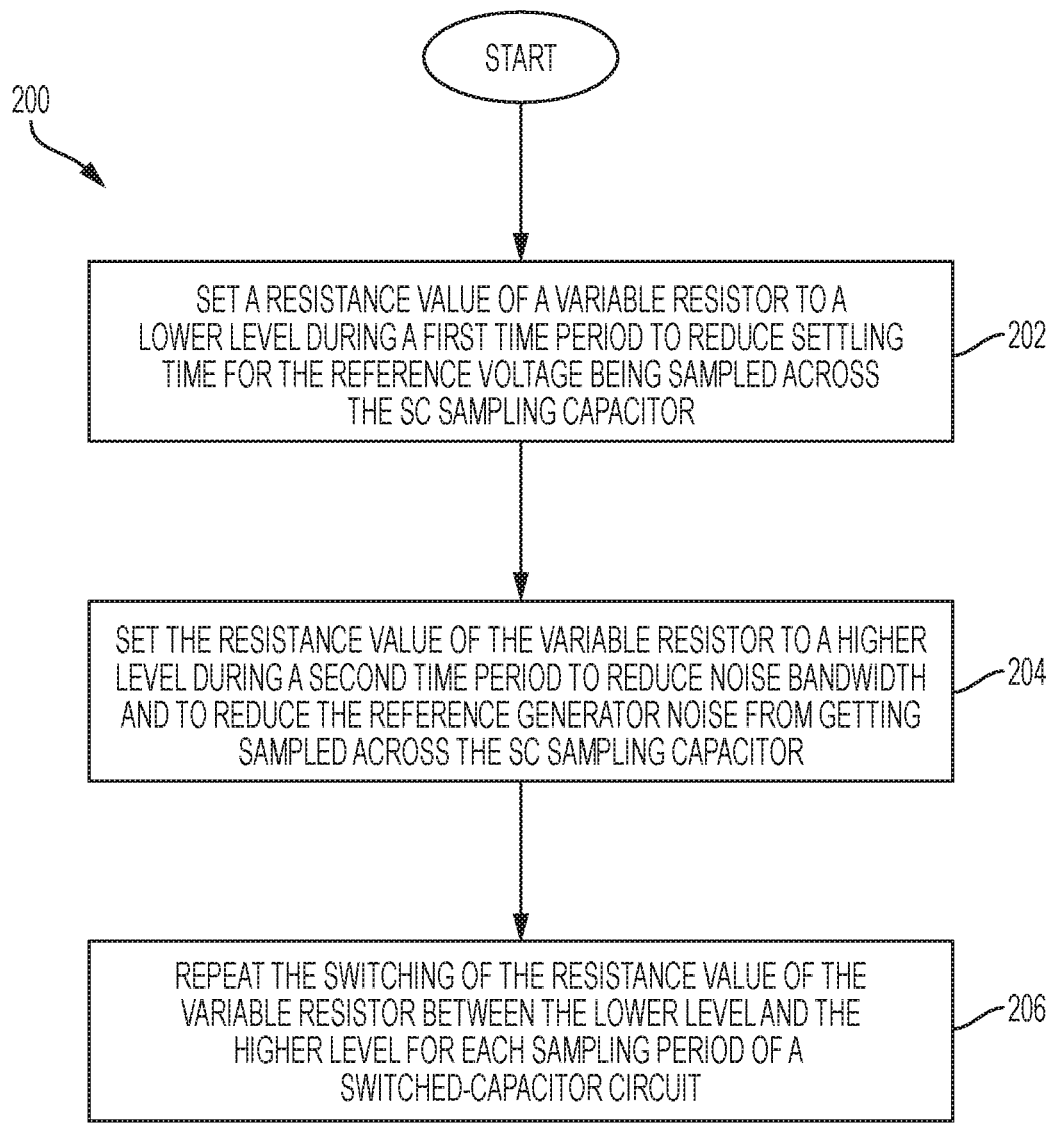
FIG. 2 is a flow chart illustrating an exemplary method for operating a variable resistor to reduce thermal noise contribution on a sampling capacitor from a reference voltage generator according to some embodiments of the disclosure.

FIG. 2 is a flow chart illustrating an exemplary method for operating a variable resistor to reduce thermal noise contribution on a sampling capacitor from a reference voltage generator according to some embodiments of the disclosure. A method 200 may begin at block 202 with setting a resistance value of a variable resistor to a lower level during a first time period to decrease settling time for the voltage reference input value at a sampling capacitor of the switched-capacitor (S-C) network. Next, at block 204, the method 200 continues with setting a resistance value of the variable resistor to a higher level during a second time period to decrease thermal noise on the sampling capacitor of the switched-capacitor (S-C) network. At block 206, the steps of blocks 202 and 204 may be repeated to adjust the resistance of the variable resistor between two or more different states during a sampling phase of the switched-capacitor circuit.

Figure 3:
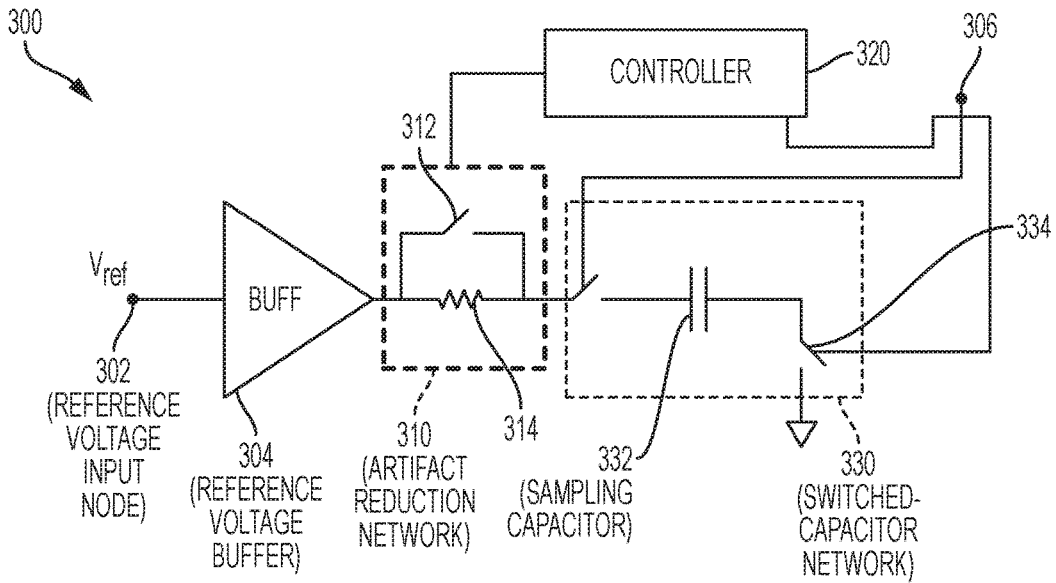
FIG. 3 is a circuit diagram illustrating a variable resistor between a reference voltage generator and a switched-capacitor network according to some embodiments of the disclosure.

One circuit that may implement a controlled variable resistor, such as may be controlled as described with reference to FIG. 2, is shown in FIG. 3. FIG. 3 is a circuit diagram illustrating a variable resistor between a reference voltage generator and a switched-capacitor network according to some embodiments of the disclosure. A circuit 300 may include an artifact reduction network (ARN) 310 coupled between a switched-capacitor (S-C) network 330 and a reference voltage input node 302. The ARN 310 may be a variable resistor and include a resistor 314 coupled in parallel with a switch 312. In operation, the reference voltage input node 302 may be coupled to a reference voltage generator, such as a band-gap reference generator. A reference voltage buffer 304 may be coupled between the variable resistor 310 and the reference voltage input node 302. The switched-capacitor network 330 may include a sampling capacitor 332 and one or more switches, such as switch 334. A controller 320 may be coupled to the variable resistor 310 for controlling a resistance level of the variable resistor 310. For example, the controller 320 may toggle the switch 312 to short and to unshort the resistor 314 to adjust the resistance of the variable resistor 314. A sampling clock input node 306 may receive a sampling clock that controls sampling of the reference voltage by the switched-capacitor network 330. The sampling clock from input node 306 may also be provided to the controller 320 to time resistance changes of the variable resistor 310. An example control of the variable resistor 310 is illustrated in a timing diagram of FIG. 4.

Figure 4:
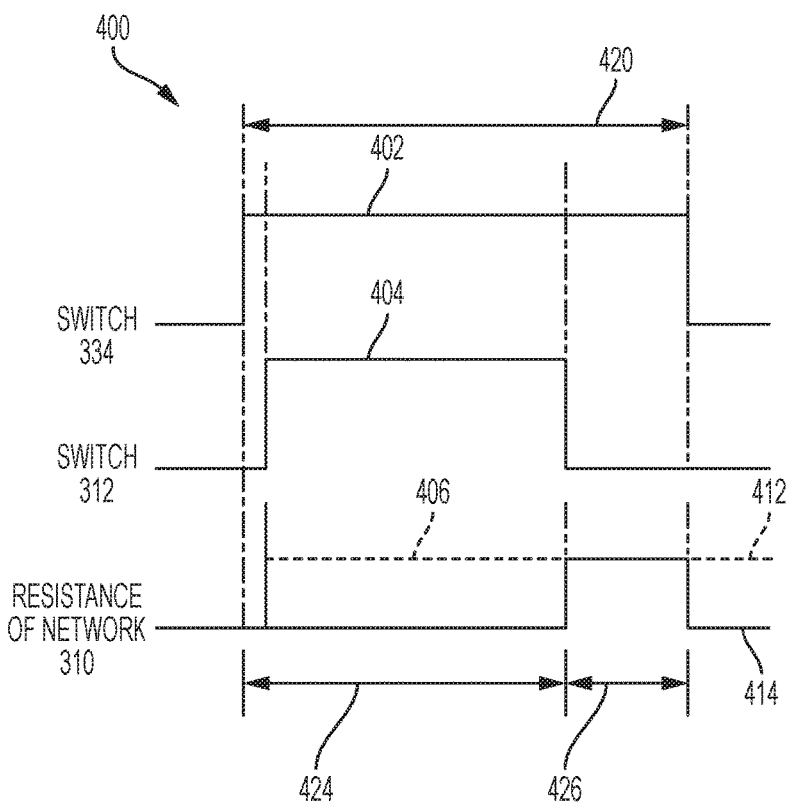
FIG. 4 is a timing diagram illustrating a changing resistance of a variable resistor during portions of a sampling period of a switched-capacitor network according to some embodiments of the disclosure.

FIG. 4 is a timing diagram illustrating a changing resistance of a variable resistor during portions of a sampling period of a switched-capacitor network according to some embodiments of the disclosure. A graph 400 includes a line 402 representing a sampling clock signal input to the switch 334, a line 404 representing a control signal for operating the switch 312, and a line 406 representing a resistance of the variable resistor 310. A sampling phase 420 of the switched-capacitor network 330 may be divided into two or more time periods. The sampling phase 420 may be divided into a first time period $t_1$ 424 and a second time period $t_2$ 426. During the sampling phase 420, the sampling clock may toggle off the switch 334 and couple the capacitor 332 to the variable resistor 310. The edge of the sampling clock may trigger the controller 320 to toggle the switch 312 to set a low resistance for the variable resistor 310. After a time period $t_1$ 424, the controller 320 may toggle the switch 312 to set a high resistance for the variable resistor 310 for the time period $t_2$ 426. The resistance toggles between a low resistance level 414 during time period 424 and a high resistance level 412 during time period 426. In one example, the sampling phase 420 may have a duration of 85 nanoseconds, and the 85 nanoseconds divided into approximately a 40-60 nanosecond (or, more specifically, 55 nanosecond) period for the time period $t_1$ 424 and a 25-45 nanosecond (or, more specifically, 30 nanosecond) period for the time period $t_2$ 426. Generally, the time periods 424 and 426 may be a duration sufficient to allow settling during the time period 424 and reduce noise bandwidth during the time period 426 and balance the two goals.

Figure 5:
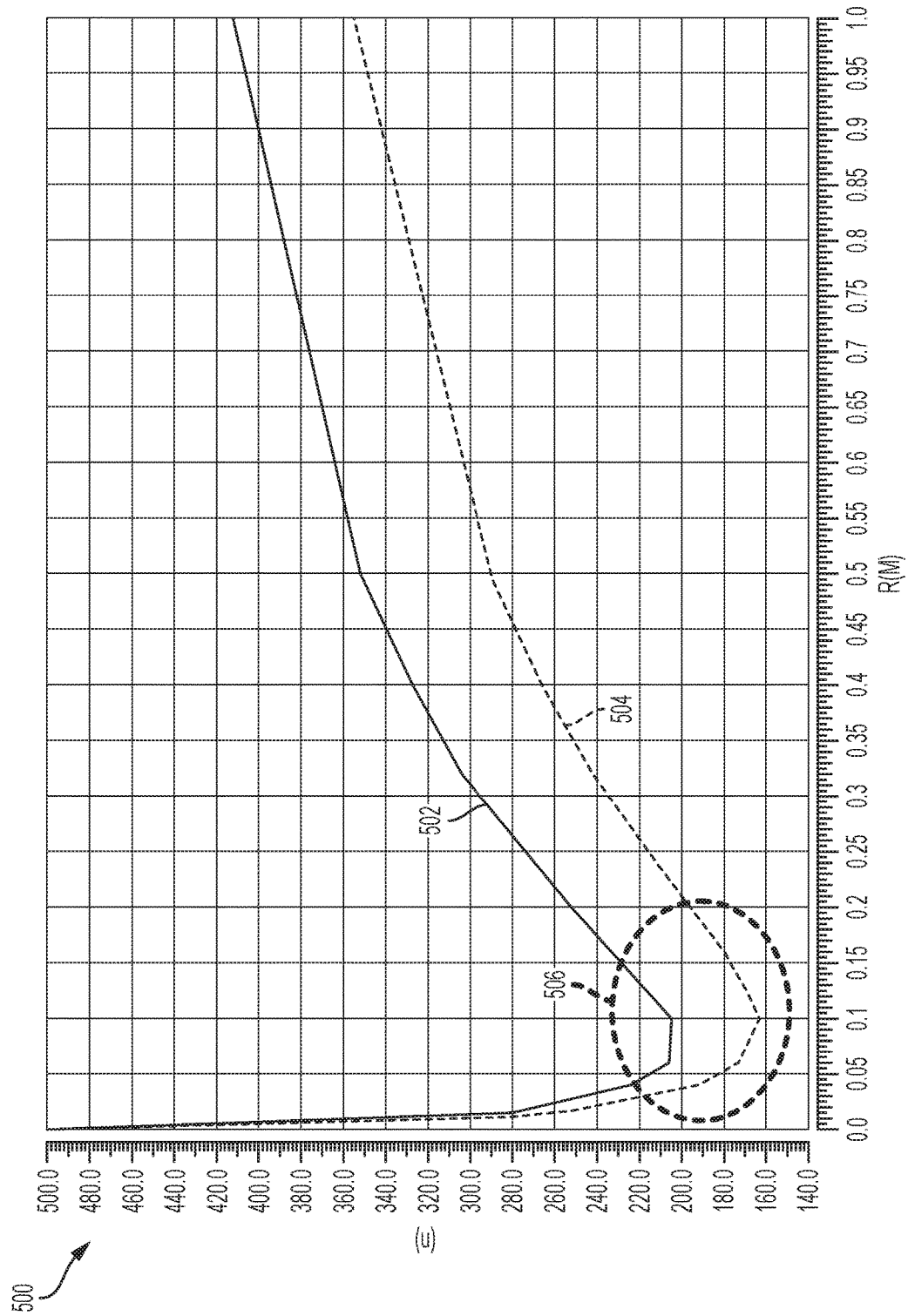
FIG. 5 is a graph illustrating reduced thermal noise contribution on a sampling capacitor from a reference voltage generator using a variable resistor according to some embodiments of the disclosure.

The reduced noise achieved through the use of the variable resistor 310 is illustrated in the graph of FIG. 5. FIG. 5 is a graph illustrating reduced thermal noise contribution on a sampling capacitor from a reference voltage generator using a variable resistor according to some embodiments of the disclosure. A graph 500 includes a line 502 for an embodiment of the circuit 300 with a shorter time period $t_2$ 426 and a line 504 for an embodiment with a longer time period $t_2$ 426. The x-axis denotes resistance values for the resistor 314. An optimal value for the resistor 314 may be in the region 506 of graph 500. In some embodiments, the resistor 314 may have a resistance value of approximately 100 kOhms, or between approximately 50 and 150 kOhms.

Figure 6:
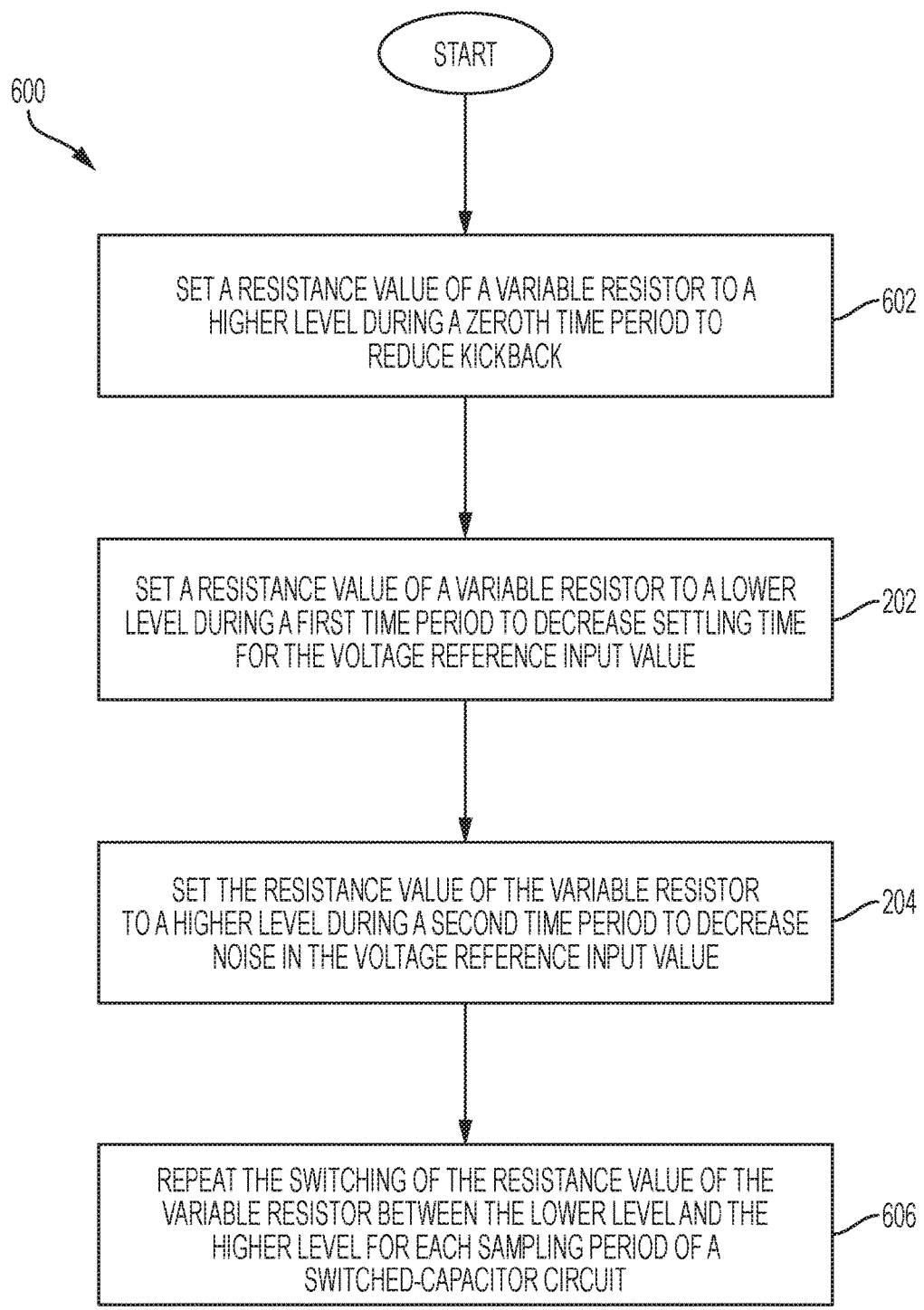
FIG. 6 is a flow chart illustrating an exemplary method for setting a variable resistor to reduce thermal noise contribution and reduce kickback according to some embodiments of the disclosure.

The sampling phase 420 may be further divided into additional time periods. For example, the sampling phase 420 may be additionally divided into an initial, or zeroth, time period. The controller 320 may set resistance values of the variable resistor 310 during the zeroth, first, and second time periods. One method for controlling the variable resistor 310 is described with reference to FIG. 6. FIG. 6 is a flow chart illustrating an exemplary method for setting a variable resistor to reduce thermal noise contribution and reduce kickback according to some embodiments of the disclosure. A method 600 may begin at block 602 with setting a resistance value of the variable resistor to a higher level during a zeroth time period. The method 600 may then continue to blocks 202 and 204 to set resistance values during a first and second time period as with blocks 202 and 204 of FIG. 2. At block 606, the zeroth, first, and second time periods may be repeated for each sampling period of a switched-capacitor circuit.

The three time periods of the switching phase correspond to three functionalities. During the zeroth time period, the shorting switch 312 is "off" to create a big resistor in a sampling path. During the first time period, a reference voltage $V_{ref}$ is sampled across the sampling capacitor 332 of the switched capacitor network 330. During this phase, the shorting switch 312 is "on" to bypass the resistor 314. The large resistor creates a sampling phase time constant that is low. During the second time period, the reference voltage $V_{ref}$ has already settled and by opening the shorting switch 312, the resistor 314 is in the sampling path, which creates a low-pass filter (LPF) limiting the reference voltage $V_{ref}$ noise bandwidth and resulting in a reduced thermal noise contribution from the reference voltage input node 302.

Figure 7:
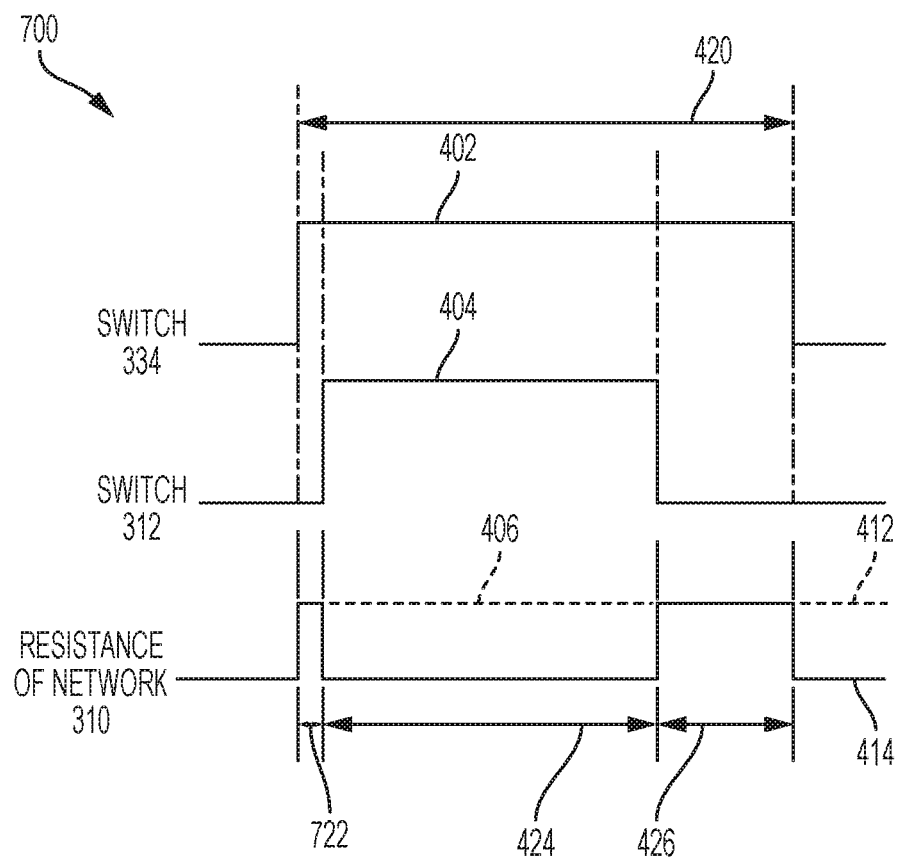
FIG. 7 is a timing diagram illustrating a changing resistance of a variable resistor during three portions of a sampling period of a switched-capacitor network according to some embodiments of the disclosure.

A timing diagram for operation of the variable resistor 310 with three time periods for a switching phase is described with reference to FIG. 7. FIG. 7 is a timing diagram illustrating a changing resistance of a variable resistor during three portions of a sampling period of a switched-capacitor network according to some embodiments of the disclosure. A graph 700 is similar to the graph 400 of FIG. 4, but includes a zeroth time period $t_0$ 722. The time period 722 may be shorter than the time periods 424 and 426. For example, a sampling phase 420 may be divided into a 5 nanosecond zeroth time period 722, a 50 nanosecond first time period 424, and a 30 nanosecond second time period 426.

A resistance value of the variable resistor 310 in the reference voltage $V_{ref}$ sampling path can have three or more values. During the zeroth time period, the resistance value may be set based on desired kickback attenuation, in which a higher resistance can further attenuate kickback. During a first time period, the resistance value may be set based on the settling requirement, in view of a switch device size that sets the switch "on" resistance. During a second time period, the resistance value may be set to match a desired level of thermal noise reduction. In some embodiments, the first time period resistance may be much smaller than the zeroth and second time period resistances. In some embodiments, the zeroth time period resistance may be equal to the second time period resistance.

The schematic flow chart diagrams of FIG. 2 and FIG. 6 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. As another example, although processing of audio data is described, other data may be processed through the analog-to-digital converters (ADCs) and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a switched-capacitor circuit comprising a reference voltage input node, wherein the switched-capacitor circuit comprises a capacitor comprising a first terminal and a second terminal, and wherein the switched-capacitor circuit further comprises a first switch coupled to the first terminal, and wherein the switched-capacitor circuit further comprises a second switch coupled to the second terminal;
   a variable resistor coupled between the reference voltage input node and components of the switched-capacitor circuit; and
   a controller configured to adjust the variable resistor, wherein the controller is configured:
      to set a resistance value of the variable resistor at a first level during a first time period; and
      to set the resistance value of the variable resistor at a second level higher than the first level during a second time period,
   wherein the first time period and the second time period are at least part of a first sampling period of the switched-capacitor circuit,
   wherein the first switch and the second switch are closed for the duration of the first sampling period, and
   wherein the controller is further configured to not short the resistor during a zeroth time period before the first time period, wherein the zeroth time period, the first time period, and the second time period comprise the first sampling period of the switched-capacitor circuit.

2. The apparatus of claim 1, wherein the variable resistor comprises a resistor coupled in parallel with a switch.

3. The apparatus of claim 2, wherein the controller is further configured to operate the switch to change the resistance value of the variable resistor.

4. The apparatus of claim 3, wherein the controller is further configured to short the resistor during the first time period and to not short the resistor during the second time period.

5. The apparatus of claim 1, wherein the zeroth time period has a duration selected to reduce kickback from the switched-capacitor circuit to the reference voltage input node, and wherein the second time period has a duration selected to reduce a thermal noise contribution from a reference on a sampling capacitor of the switched-capacitor circuit during a sampling phase.

6. The apparatus of claim 1, wherein the controller is further configured to set the resistance value of the variable resistor at a third level higher than the first level during a zeroth time period before the first time period.

7. An apparatus, comprising:
   a switched-capacitor circuit comprising a reference voltage input node, wherein the switched-capacitor circuit comprises a capacitor comprising a first terminal and a second terminal, and wherein the switched-capacitor circuit further comprises a first switch coupled to the first terminal, and wherein the switched-capacitor circuit further comprises a second switch coupled to the second terminal;

a variable resistor coupled between the reference voltage input node and components of the switched-capacitor circuit; and a controller configured to adjust the variable resistor, wherein the controller is configured:

to set a resistance value of the variable resistor at a first level during a first time period; and to set the resistance value of the variable resistor at a second level higher than the first level during a second time period, to not short the resistor during a zeroth time period before the first time period, wherein the zeroth time period, the first time period, and the second time period comprise the first sampling period of the switched-capacitor circuit, and wherein the first switch and the second switch are closed for at least the duration of the first time period and the second time period of the first sampling period, wherein the switched-capacitor circuit is part of an analog-to-digital converter (ADC), and the reference voltage input node is coupled to an on-chip reference voltage generator.

8. A method of reducing noise coming from an on-chip reference in a switched-capacitor circuit, wherein the switched-capacitor circuit comprises a capacitor comprising a first terminal and a second terminal, and wherein the switched-capacitor circuit further comprises a first switch coupled to the first terminal, and wherein the switched-capacitor circuit further comprises a second switch coupled to the second terminal, the method comprising:

controlling a variable resistor coupled between the switched-capacitor circuit and the on-chip reference by performing steps comprising:

setting a resistance value of the variable resistor at a first level during a first time period of a first sampling period of the switched-capacitor circuit; and setting the resistance value of the variable resistor at a second level higher than the first level during a second time period of the switched-capacitor circuit, wherein the first time period and the second time period are at least part of a first sampling period of the switched-capacitor circuit, wherein the first switch and the second switch are closed for the duration of the first sampling period, and wherein the step of controlling the variable resistor further comprises the step of setting the resistance value of the variable resistor at a third level lower than the second level during a zeroth time period before the first time period.

9. The method of claim 8, wherein the step of controlling the variable resistor comprises controlling a switch coupled in parallel with a resistor.

10. The method of claim 9, wherein the step of setting the resistance value of the variable resistor at the first level comprises shorting the resistor with the switch, and wherein the step of setting the resistance value of the variable resistor at the second level comprises not shorting the resistor with the switch.

11. The method of claim 8, wherein the zeroth time period has a duration selected to reduce feedback from the switched-capacitor circuit to the on-chip reference, and wherein the second time period has a duration selected to reduce thermal noise in a received reference voltage level from the on-chip reference.

12. The method of claim 8, wherein the step of controlling the variable resistor is performed during conversion of an input analog signal to an output digital signal.

13. A method of reducing noise coming from an on-chip reference in a switched-capacitor circuit, comprising:

providing a first switch and a second switch and a capacitor coupled through a first terminal and a second terminal to the first switch and the second switch, respectively, to form the switched-capacitor circuit;

coupling an artifact reduction network (ARN) between the switched-capacitor circuit and an output of a buffer of the on-chip reference, wherein the ARN is transparent during a first time period of a sampling phase to not affect settling accuracy and is activated during another portion of the sampling phase to limit sampling network bandwidth during a second time period of the sampling phase, wherein the first switch and the second switch are closed for the duration of the first sampling period; and controlling the artifact reduction network (ARN) to set the resistance value of the artifact reduction network (ARN) at a third level lower than the second level during a zeroth time period before the first time period.

14. The method of claim 13, wherein the step of coupling the artifact reduction network (ARN) comprises coupling a switch in parallel with a resistor between the switched-capacitor circuit and the output of the buffer of the on-chip reference.

15. The method of claim 14, further comprising:

controlling the artifact reduction network (ARN) to set a resistance value of the artifact reduction network (ARN) at a first level during a first time period of a first sampling period of the switched-capacitor circuit such that the artifact reduction network (ARN) is transparent; and controlling the artifact reduction network (ARN) to activate the artifact reduction network (ARN) by setting the resistance value of the artifact reduction network (ARN) at a second level higher than the first level during a second time period of the switched-capacitor circuit.

16. The method of claim of claim 15, wherein the step of controlling the artifact reduction network (ARN) to set the resistance value of the artifact reduction network (ARN) at the first level comprises controlling the switch to short the resistor.

* * * * *